United States Patent
Aoyagi et al.

(10) Patent No.: US 6,893,712 B2
(45) Date of Patent: *May 17, 2005

(54) TRANSPORT MEMBER

(75) Inventors: Kenichi Aoyagi, Yokohama (JP);
Takashi Kobayashi, Yokohama (JP);
Daisuke Uchida, Yokohama (JP)

(73) Assignee: Nippon Mitsubishi Oil Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/955,178

(22) Filed: Sep. 19, 2001

(65) Prior Publication Data

US 2003/0170440 A1 Sep. 11, 2003

(51) Int. Cl.[7] .............................................. B32B 27/04
(52) U.S. Cl. .................... 428/297.4; 428/116; 428/284;
428/292.1; 428/304.4; 428/311.11; 428/315.9;
428/411.1
(58) Field of Search ............................. 428/116, 292.1,
428/304.4, 311.11, 411.11, 315.9, 284,
297.4

(56) References Cited

U.S. PATENT DOCUMENTS

| | | | | |
|---|---|---|---|---|
| 4,680,216 A | * | 7/1987 | Jacaruso .................. | 428/116 |
| 4,767,656 A | * | 8/1988 | Chee et al. .............. | 428/116 |
| 5,085,928 A | * | 2/1992 | Krueger ................... | 428/287 |
| 5,106,668 A | * | 4/1992 | Turner et al. ............ | 428/116 |
| 5,204,033 A | * | 4/1993 | Pearce et al. ............ | 264/136 |
| 5,472,653 A | * | 12/1995 | Onoda et al. ............ | 264/152 |
| 5,653,331 A | * | 8/1997 | Graf ......................... | 198/807 |
| 5,916,682 A | * | 6/1999 | Horii et al. .............. | 428/408 |
| 2003/0054131 A1 | * | 3/2003 | Ooshima et al. ........ | 428/113 |

FOREIGN PATENT DOCUMENTS

| | | | |
|---|---|---|---|
| JP | 03-061528 | * | 3/1991 |
| JP | 04-215599 | * | 8/1992 |
| JP | 8-288364 | | 11/1996 |
| JP | 11-354608 | * | 12/1999 |
| JP | 2001-44259 | | 2/2001 |
| JP | 2001-044259 | * | 2/2001 |

* cited by examiner

*Primary Examiner*—Rena Dye
*Assistant Examiner*—Camie Thompson
(74) *Attorney, Agent, or Firm*—Finnegan, Henderson, Farabow, Garrett & Dunner, LLP (57) ABSTRACT

The transport member of the present invention is a laminate of skin and core layers made of CFRP. The skin layer comprises a prepreg made of a pitch type carbon fiber, oriented by −20° to +20° with respect to a longitudinal direction (X-axis direction) of the transport member, having a tensile elasticity of 500 to 1000 GPa; and a prepreg of PAN type carbon fiber, oriented by +75° to +90° and/or −75° to −90° with respect to the longitudinal direction, having a tensile elasticity of 200 to 400 GPa. As a consequence, a transport member which is light in weight, easy to handle, while being excellent in its bending rigidity, vibration damping characteristic, and heat resistance can be obtained.

14 Claims, 6 Drawing Sheets

TRANSPORT MEMBER

BACKGROUND OF THE INVENTION

1. Field of the Invention

The present invention relates to a transport member such as one used for an industrial robot, for example; and, more specifically, to a transport member used when transporting a semiconductor wafer, a liquid-crystal substrate, or the like to the inside and outside of a firing process furnace, and the like.

2. Related Background Art

Industrial robots have been widely in use for transporting semiconductor wafers, liquid-crystal substrates, and the like (hereinafter referred to as "substrates and the like") into firing process furnaces at it a high temperature (about 300° C.). In recent years, as the substrates and the like increase their size, fiber-reinforced plastics (hereinafter referred to as "FRP") such as carbon-fiber reinforced plastics (hereinafter referred to as "CFRP") in particular, which are lighter in weight and easier to handle as compared with metal members having a similar bending rigidity (resistance to bending), have begun to be used in members for mounting the substrates and the like in industrial robots, such as transport members known as robot hands and effectors, for example.

SUMMARY OF THE INVENTION

The inventors studied such conventional transport members made of CFRP in detail and have found that their bending rigidity, vibration damping characteristic (resistance to vibration), heat resistance, and the like are not always sufficient for transporting large-size substrates and the like in high-temperature environments and the like in particular.

In view of such circumstances, it is an object of the present invention to provide a transport member which is light in weight, easy to handle, and excellent in bending rigidity, vibration damping characteristic, and heat resistance, thus being fully suitable for transporting large-size substrates and the like in high-temperature environments.

The inventors carried out diligent studies in order to achieve the above-mentioned object and, as a result, have found that the above-mentioned various characteristics of a transport member can be improved when unidirectional reinforced fibers having fiber orientation directions different from each other are combined together, even without enhancing the bending rigidity of a single member, thereby attaining the present invention.

Namely, the transport member of the present invention essentially consists of FRP; wherein the FRP comprises at least one first layer containing a unidirectional reinforced fiber, oriented by −20° to +20° with respect to a longitudinal direction of the transport member, having a tensile elasticity of 500 to 1000 GPa; and at least one second layer containing a unidirectional reinforced fiber, oriented by +75° to +90° and/or −75° to −90° with respect to the longitudinal direction of the transport member, having a tensile elasticity of 200 to 400 GPa.

The transport member of the present invention may be either a planar member or a tubular member. In the case of a tubular member, the axial direction thereof is defined as the above-mentioned longitudinal direction. CFRP is particularly preferable as the FRP.

As compared with the cases where one of the first and second layers is used alone, the transport member of the present invention configured as mentioned above yields a bending rigidity better than that expectable from the respective tensile elasticities of the first and second layers, due to a synergetic effect obtained when they are combined together. In addition, since the respective tensile elasticities of the first and second layers are set appropriately, the logarithmic vibration damping factor of at least one layer can be enhanced, whereby the vibration damping characteristic against the bending vibration improves in particular.

Also, since the bending rigidity improves, the occurrence of warpage and deflection can be suppressed to the minimum even when thermal load is exerted on the transport member due to a thermal shock occurring at the time of letting the transport member in or out of an electric furnace, for example. Further, since the bending rigidity and the vibration damping characteristic against the bending vibration improve remarkably, the amount of use of reinforced fiber can be reduced, whereby the transport member can be made lighter in weight and easier to handle.

Specifically, when the tensile elasticity of the unidirectional reinforced fiber in the first layer is 500 to 1000 GPa, the logarithmic vibration damping factor of the first layer can be enhanced favorably, whereby the vibration damping characteristic of the transport member can further be improved reliably. When the tensile A elasticity of the unidirectional reinforced fiber in the second layer is 200 to 400 GPa, on the other hand, both the bending rigidity and the vibration damping characteristic of the whole transport member can be improved in harmony with each other.

Preferably, the FRP further comprises at least one third layer containing a unidirectional reinforced fiber, oriented by +30° to +60° and/or −30° to −60° with respect to the longitudinal direction of the transport member, having a tensile elasticity of 500 to 1000 GPa.

As a consequence of such a configuration, the reinforced fiber constituting the third layer is oriented so as to obliquely intersect the orientating directions of the respective reinforced fibers constituting the first and second layers, whereby the rigidity of the transport member against its torsion (resistance to torsion; hereinafter referred to as "torsional rigidity") can be enhanced. As a result, the torsional vibration can be lowered, whereby the vibration damping characteristic of the transport member against the torsional vibration can be improved.

When the tensile elasticity of the unidirectional reinforced fiber in the third layer is 500 to 1000 GPa, the tensile elasticity of the reinforced fiber in the third layer can become on a par with the tensile elasticity of the reinforced fiber constituting the first layer, whereby the bending rigidity of the transport member in the above-mentioned obliquely intersecting direction can be improved to a level on a par with the bending rigidity with respect to the longitudinal direction.

In another aspect, the transport member in accordance with the present invention may comprise skin and core layers essentially consisting of FRP; wherein the skin layer comprises at least two first layers containing a unidirectional reinforced fiber, oriented by −20° to +20° with respect to a longitudinal direction of the transport member, having a tensile elasticity of 500 to 1000 GPa.

Preferably, the core layer comprises at least two second layers containing a unidirectional reinforced fiber, oriented by +75° to +90° and/or −75° to −90° with respect to the longitudinal direction of the transport member, having a tensile elasticity of 200 to 400 GPa; or at least one third layer containing a unidirectional reinforced fiber, oriented by +30° to +60° and/or −30° to −60° with respect to the longitudinal direction of the transport member, having a tensile elasticity of 500 to 1000 GPa.

More specifically, it is desirable that the unidirectional reinforced fiber in the first layer and/or third layer be a pitch type carbon fiber, and that the unidirectional reinforced fiber in the second layer be a polyacrylonitrile type (hereinafter referred to as "PAN type") carbon fiber.

Using a pitch type carbon fiber as the reinforced fiber of the first layer and/or third layer is advantageous in that it becomes easier to achieve the above-mentioned favorable tensile elasticity in the first layer and/or third layer, whereas using a PAN type carbon is advantageous in that it becomes easier to achieve the above-mentioned favorable tensile elasticity in the second layer. In other words, a transport member excellent in the strength (bending rigidity) and vibration damping characteristics in particular can be obtained when the pitch type carbon fiber and PAN type carbon fiber are used as the reinforced fibers of the first and second layers, respectively.

More specifically, the transport member in accordance with the present invention may comprise laminated skin and core layers made of CFRP; wherein the skin layer may comprise a first layer containing a first carbon fiber, oriented by an angle range of −20° to +20° with respect to a longitudinal direction of the transport member, having a tensile elasticity of 500 to 1000 GPa; and a second layer containing a second carbon fiber, oriented by an angle range of +75° to +90° and/or −75° to −90° with respect to the longitudinal direction, having a tensile elasticity of 200 to 400 GPa.

The bending elasticity of the transport member in the longitudinal direction thereof is preferably 200 to 800 GPa, more preferably 220 to 700 GPa; whereas the bending elasticity of the transport member in the transverse direction thereof is preferably 30 to 100 GPa, more preferably 40 to 90 GPa. This is advantageous in that the rigidity of the transport member in the longitudinal direction can be kept high while improving the rigidity in the transverse direction.

It will be further useful if the above-mentioned skin and core layers satisfy the relationship represented by the following expression (1):

$$(T_s+T_c) \times 0.2 \leq T_s \leq (T_s+T_c) \times 0.4 \quad (1)$$

where $T_s$ is the thickness of the skin layer, and $T_c$ is the thickness of the core layer.

Sufficient bending rigidity and vibration damping characteristic may not be obtained when $T_s$ is less than $(T_s+T_c) \times 0.2$. When $T_s$ exceeds $(T_s+T_c) \times 0.4$, by contrast, bending rigidity and vibration damping characteristic tend to improve more than necessary, whereas the tendency of the bending rigidity to increase relative to the increase in thickness of the skin layer is likely to slow down. Hence, regulating the thicknesses of the skin and core layers so as to satisfy the above-mentioned expression (1) makes it possible to achieve sufficient bending rigidity and vibration damping characteristic by a minimally required amount of use of FRP, which is advantageous from the viewpoints of reducing the weight and improving the economy.

When the whole transport member is constituted by CFRP in the present invention, for example, the layer oriented by +75° to +90° and/or −75° to −90°, i.e., the second layer, constitutes the whole or part of the core layer. By contrast, the second layer constitutes a part of the skin layer in the case where the transport member includes constituent members, such as a honeycomb, other than CFRP as shown in embodiments which will be explained later. Such a relationship is also taken into consideration in the above-mentioned expression (1).

In the skin layer, the volume of the first layer is preferably 20 to 100 vol % (the skin layer may be constituted by the first layer alone), more preferably 50 to 80 vol %. The volume of the second layer (constituting either the skin layer or the core layer) is preferably 0 to 80 vol %, more preferably 20 to 50 vol %.

When the ratio between the volume of the first layer and the volume of the second layer in the skin layer deviates from such a favorable volume ratio, the bending rigidity in one of the longitudinal and transverse directions of the transport member becomes extremely greater than that in the other direction. Hence, the bending rigidities in the longitudinal and transverse directions of the transport member are favorably kept in balance when the volume ratio between the first and second layers is set within the above-mentioned range.

A bending rigidity in the longitudinal direction is usually required for the transport member. It tends to be cons difficult for the transport member to fully secure the bending rigidity in the longitudinal direction when the volume ratio of the first layer is less than 20 vol %. Hence, a sufficient bending rigidity in the longitudinal direction of the transport member is obtained when the respective volume ratios of the first and second layers fall within the above-mentioned ranges.

The volume of the third layer in the core layer is preferably 0 to 20 vol % (there may be a case using no third layer), more preferably 5 to 20 vol %. When the volume ratio of the third layer exceeds 20 vol %, the effect of improving the torsional rigidity of the transport member tends to be saturated. Hence, the torsional rigidity corresponding to the amount of use of the third layer can reliably be imparted to the transport member if the volume ratio of the third layer is set within the above-mentioned range.

More specifically, the logarithmic vibration damping factor of the transport member against bending vibration is preferably 0.01 to 0.05, more preferably 0.02 to 0.05.

The bulk specific gravity of the core layer is a value preferably within the range of 0.03 to 1.7, more preferably 0.3 to 0.5, while being lower than the bulk specific gravity of the skin layer.

It will be useful if the core layer comprises a honeycomb, a porous body, a corrugated sheet, a fiber-reinforced plastic, a resin sheet, or a combination of at least two kinds thereof.

In the following, "$\pm\theta_a°$ to $\pm\theta_b°$" indicates "+$\theta_a°$ to +$\theta_b°$ and/or −$\theta_a°$ to −$\theta_b°$." For example, "±75° to ±90°" indicates "+75° to +90° and/or −75° to −90°."

The "tensile elasticity" and "tensile strength" of reinforced fiber in the present invention are values determined by methods defined in Japanese Industrial Standard JIS R 7601. Further, "fiber volume content," "resin volume content," and "void content" are values determined by methods defined in Japanese Industrial Standard JIS K 7075.

Furthermore, "bending elasticity" and "bending strength" are values determined by methods defined in Japanese Industrial Standard JIS K 7074, whereas the "logarithmic vibration damping factor" is a value determined by the method shown in the following.

Logarithmic Vibration Damping Factor Against Bending Vibration

A cantilever of a planar sample was vertically raised with its lower side being fixed. This cantilever was vibrated in the atmosphere (while using an electromagnetic transducer for generating vibration), and the horizontal displacement of the center part of the cantilever was measured with a noncontact type sensor.

The displacement signal was captured into a personal computer by way of an amplifier and an AD converter. At this time, the sampling time for capturing the displacement signal into the personal computer was 1 to 10 msec, while the number of sampling points was 4096 points Based on the sampling data of displacement signal, the logarithmic vibration damping factor R was calculated according to the relationship is represented by the following expression (2):

$$R = \ln(A_n/A_{n+1}) \quad (2)$$

Here, $A_n$ and $A_{n+1}$ are amplitudes of a vibration waveform per period. On the other hand, ln is $\log_e$ (natural logarithm).

When the difference between adjacent amplitudes was small in the actual calculation, the logarithmic vibration damping factor R was calculated from the ratio between distanced amplitudes of the vibration waveform in order to improve the accuracy. Here, the logarithmic vibration damping factor R can be determined according to the relationship represented by the following expression (3):

$$R = \{\ln(A_n/A_m))\}/(m-n) \quad (3)$$

Here, $A_n$ is the amplitude of the n-th vibration waveform, $A_m$ is the amplitude of the m-th vibration waveform, and n<m. Also, in is $\log_e$ (natural logarithm).

Logarithmic Vibration Damping Factor Against Torsional Vibration

Figure 6:
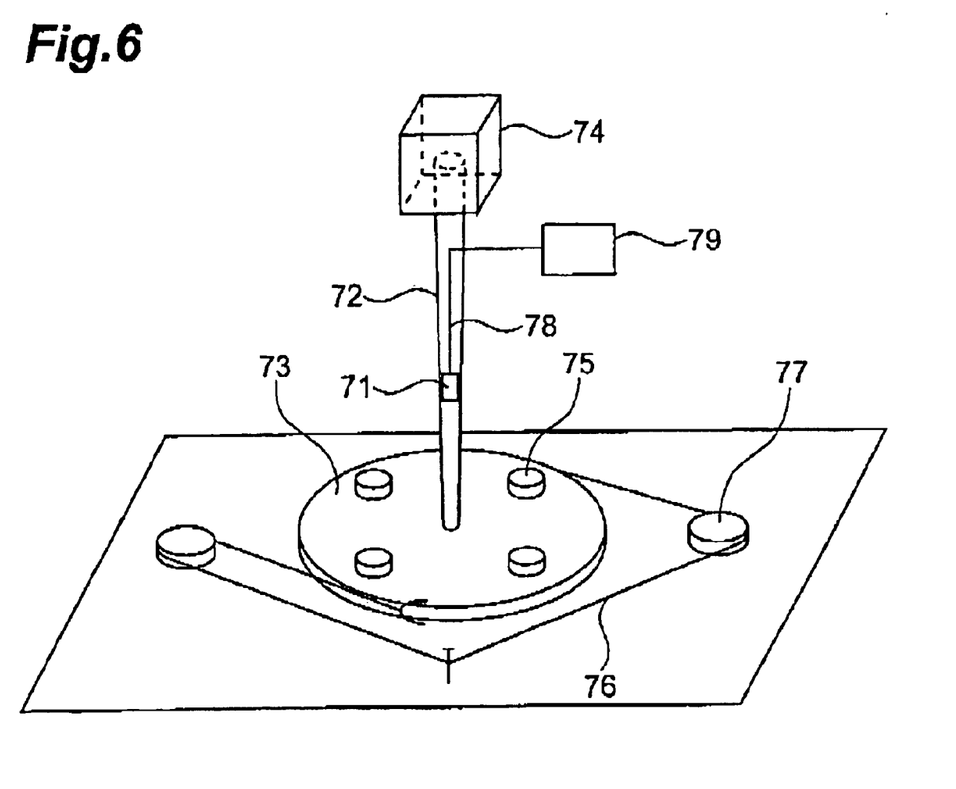
FIG. 6 is a schematic view showing a state where the logarithmic vibration damping factor against torsional vibration in the present invention is measured.

As shown in FIG. 6, a tubular sample 72 having a strain gauge 71 attached thereto was vertically raised on a weighted disc 73 with its thinner side facing down, and was vibrated with its thicker side being fixed to a vise 74. The vibration waveform of the torsional distortion at this time was measured, and the logarithmic vibration damping factor was calculated according to thus measured vibration waveform.

The torsional distortion was measured by a four-active-gauge method using two sheets of biaxial 0/90° torque measuring strain gauges in order to obtain pure torsional distortion. The strain gauges 71 were attached to two locations separated from the thinner tip part of the tubular sample 72 by a predetermined distance (only one of them being depicted).

The distortion signal was captured into a personal computer by way of a bridge box, a dynamic strain meter, and an AD converter. At this time, the sampling time for capturing the displacement signal into the personal computer was 0.1 to 1 msec, while the number of sampling points was 1000 to 8192 points.

The thinner tip of the tubular sample 72 was fixed to the weighted disc 73 whose mass was evenly distributed in its circumferential direction, such that the center thereof and the axis of the tubular sample 72 coincided with each other. The moment of inertia about the axis of the tubular sample 72 can be changed when the size, material, and number of weights 75 on the disc 73 are altered.

Further, two strings 76 were attached to two intersections between a diameter and the circumference of the weighted disc 73, respectively, and were pulled at the same time so as to impart a torsional moment to the tubular sample with no bending moment. Thereafter, the moment was released at once, so as to allow freely decaying vibration. The torsional vibration was measured for several seconds immediately after the force was released. Then, as in the above-mentioned method of calculating the logarithmic vibration damping factor against bending vibration, the logarithmic vibration damping factor against torsional vibration was calculated.

DESCRIPTION OF THE PREFERRED EMBODIMENTS

In the following, preferred embodiments of the transport member in accordance with the present invention will be explained with reference to the accompanying drawings. Here, constituents identical to each other will be referred to with numerals or letters identical to each other without repeating their overlapping explanations.

As mentioned above, FIG. 1 is a perspective view showing the configuration of a first embodiment of the transport member in accordance with the present invention. The transport member 1 shown in FIG. 1 comprises skin layers 11a, 11b formed from CFRP, and a core layer 12 laminated therebetween; while yielding a form in which one of end parts in the longitudinal direction (depicted X-axis direction) is bifurcated. A substrate 2 is adapted to be mounted on thus bifurcated end part. In general, a transport member having such a form is known as effector.

With the part without bifurcation (hereinafter referred to as "proximal part") being fixed, the transport member 1 is transported in a so-called cantilever state while holding the substrate 2 (see FIG. 2).

Figure 2:
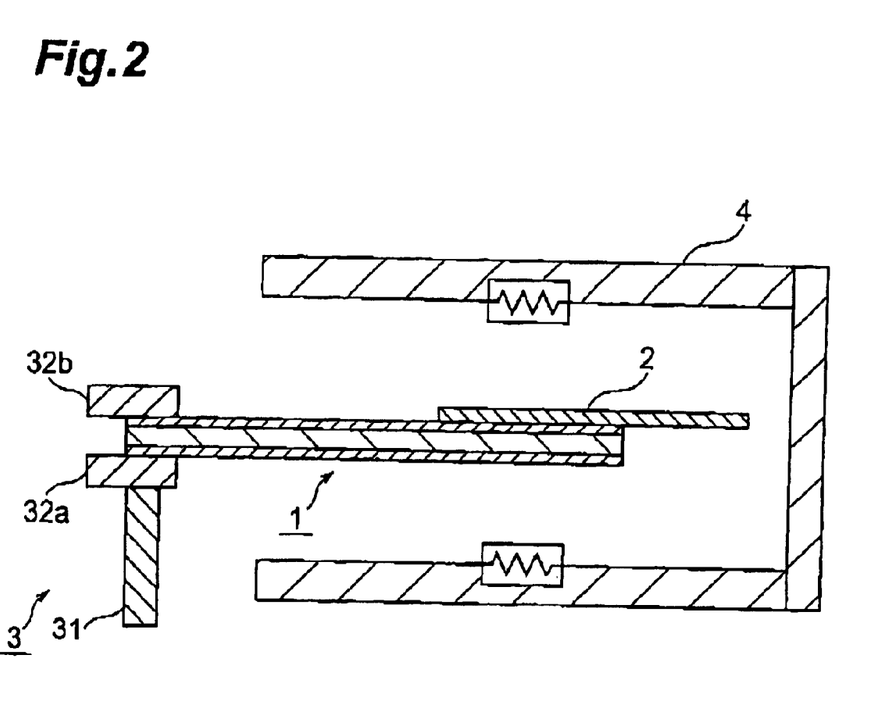
FIG. 2 is a sectional view schematically showing a state where a substrate is transported by use of a preferred embodiment of the transport member in accordance with the present invention.

Namely, as shown in FIG. 2, the proximal part of the transport member I is secured to a fixing element 3 constituted by a pillar 31 and jigs 32a, 32b. Also, it is configured so as to transport the substrate mounted on the front end part into an electric furnace 4 at a high temperature, hold the substrate 2 during a period of time when the substrate 2 is subjected to a firing process, and transport the substrate to the outside of the electric furnace 4 after the tiring process is completed.

Figure 1:
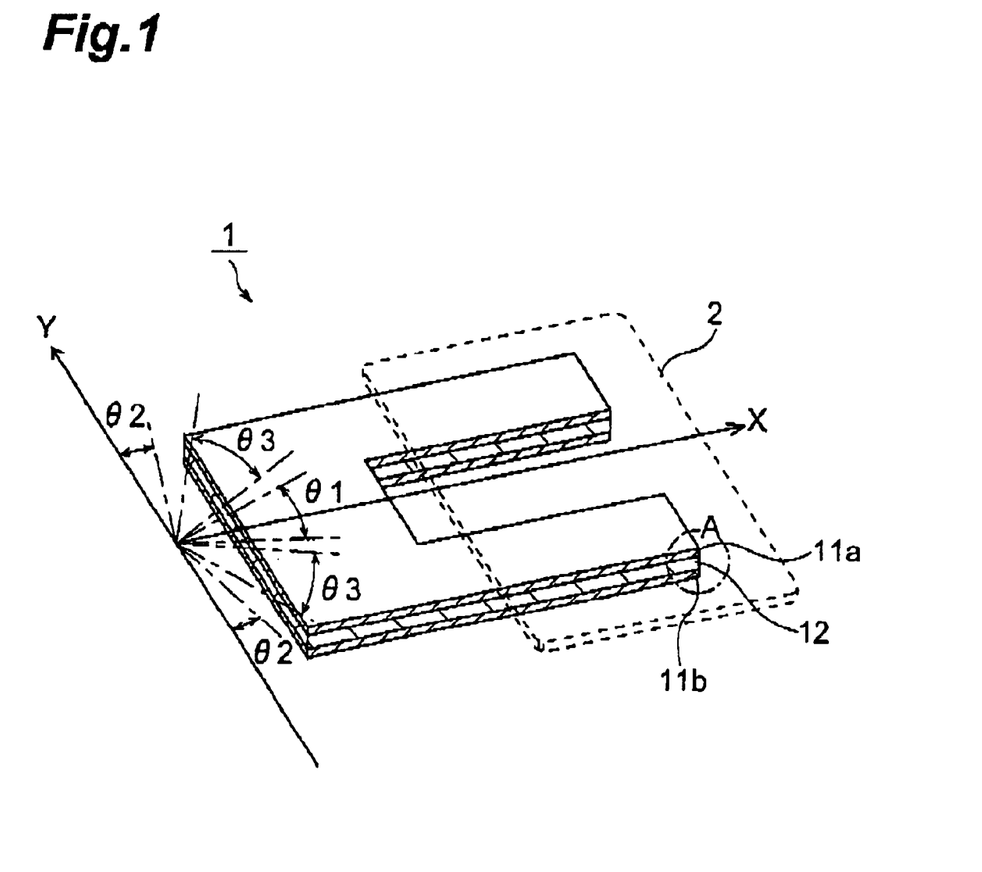
FIG. 1 is a perspective view showing the configuration of a first embodiment of the transport member in accordance with the present invention.
Figure 3:
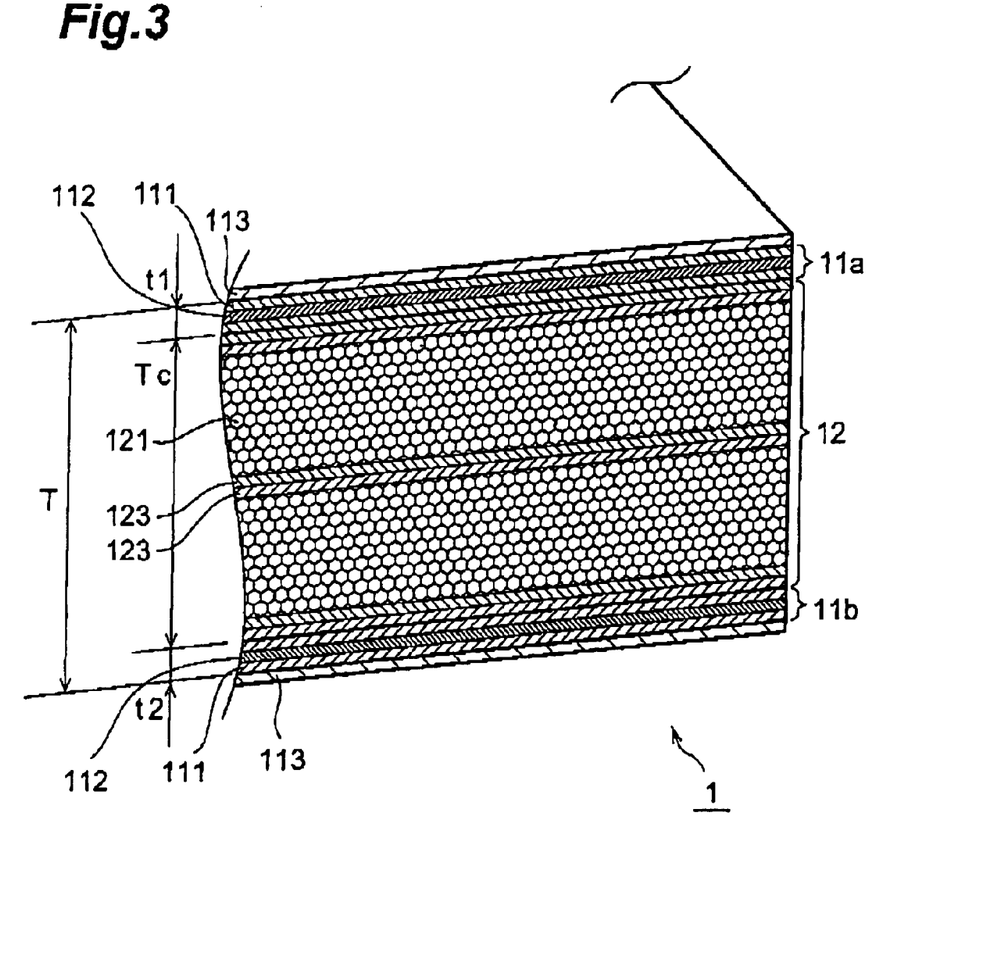
FIG. 3 is a perspective view showing the structure of part A in FIG. 1.

FIG. 3 is a perspective view showing, under magnification, the structure of part A shown in FIG. 1. As depicted, each of the skin layers 11a, 11b has a structure in which a plurality of prepregs 111 (first layers) and prepregs 112 (second layers) are laminated.

Each prapreg 111 is a unidirectional prepreg of CFRP using a pitch type carbon fiber (first carbon fiber) oriented by an angle range $\theta_1$ (see FIG. 1) of −20° to +20°, preferably −10° to +10° with respect to the longitudinal direction (X-axis direction) of the transport member 1 shown in FIG. 1 as a reinforced fiber, while using a bismaleimide resin as a matrix.

The pitch type carbon fiber used in the prepregs 111 has a tensile elasticity and a tensile strength of 500 to 1000 GPa and 100 to 6000 MPa (preferably 3000 to 6000 MPa), respectively. The total volume of the prepregs 111 used in the skin layers 11a, 11b is 50 to 80 vol % of the total volume of the skin layers 11a, 11b.

On the other hand, each prepreg 112 is a unidirectional prepreg or two-dimensionally woven prepreg of CFRP using a PAN type carbon fiber (second carbon fiber) oriented by an angle range $\theta_2$ (see FIG. 1) of ±75° to ±90°, preferably ±80° to ±90° with respect to the longitudinal direction as a reinforced fiber, while using a bismaleimide resin as a matrix.

The PAN type carbon fiber used in the prepregs 112 has a tensile elasticity and a tensile strength of 200 to 400 GPa and 100 to 6000 MPa, respectively. The total volume of the prepregs 112 used in the skin layers 11a, 11b is 20 to 50 vol % of the total volume of the skin layers 11a, 11b.

Preferably, the prepregs 111, 112 are laminated such that the prepreg 111 is disposed on the outer side while the prepreg 112 is disposed on the inner side as shown in FIG. 3. Also, a plurality of prepregs 111, 112 may be laminated alternately.

Preferably, the total thickness of the skin layers 11a, 11b and the thickness of the core layer 12 are 20 to 40% and 60 to 80% of the total thickness of the transport member 1 (excluding the thickness of prepregs 113 as a cross layer explained later), respectively. Namely, as shown in FIG. 3, letting $t_1$ and $t_2$ be the respective thicknesses of the skin layers 11a, 11b, and $T_c$ be the thickness of the core layer 12, it is desirable that these thicknesses satisfy the relationship represented by the following expression (4):

$$T \times 0.2 \leq T_s \leq T \times 0.4 \quad (4)$$

where $T_s = t_1 + t_2$ and $T = T_s + T_c$.

The core layer 12 nay be formed by core members 121 having a honeycomb form and, preferably, prepregs 123 (third layers) which are laminated as shown in FIG. 3. Each prepreg 123 is CFRP using a pitch type carbon fiber (third carbon fiber) oriented by an angle range $\theta_3$ (see FIG. 1) of ±30° to ±60°, preferably ±35° to ±55°, more preferably ±40° to ±50° with respect to the longitudinal direction (X-axis direction) of the transport member 1 shown in FIG. 1 as a reinforced fiber, while using a bismaleimide resin as a matrix.

The pitch type carbon fiber used in the prepregs 123 has a tensile elasticity and a tensile strength of 500 to 1000 GPa and 100 to 6000 MPa (preferably 3000 to 6000 MPa), respectively.

The total volume of the prepregs 123 is preferably 0 to 20 vol % (there may be a case using no prepregs 123), particularly preferably 5 to 20 vol % of the total volume of the core layer 12. Here, the volume of the core members 121 is 80 to 100 vol % of the total volume of the core layer 12.

The bending strength of thus configured transport member 1 is usually 100 to 1000 MPa, preferably 200 to 800 MPa, more preferably 300 to 600 MPa. The bending elasticity of the transport member 1 in the longitudinal direction is usually 200 to 800 GPa, preferably 220 to 700 GPa, whereas its bending elasticity in the transverse direction is usually 30 to 100 GPa, preferably 40 to 90 GPa. The coefficient of thermal expansion in the longitudinal direction within a plane is usually −3.0 to $20 \times 10^{-6}$/° C., preferably −2.0 to $10 \times 10^{-6}$/° C., more preferably −1.0 to $7.0 \times 10^{-6}$/° C.

An example of method of making the transport member 1 having such a configuration is a method in which layers of FRP or the like constituting the skin layer 11a, core layer 12, and skin layer 11b are successively molded so as to prepare an integrated planar member, and this planar member is machined into a desirable form.

Suitable as the method of molding FRP layers in the case where prepregs are used as in this embodiment is autoclave molding method or press molding method. Examples of other molding methods include known hand lay-up method, RTM (resin transfer molding) method, FW (filament winding) method, and SMC (sheet molding compound) method.

In particular, from the viewpoint of excellent adhesion between individual layers, the autoclave and press molding methods using prepregs are preferable among them. For exhibiting the high elasticity of carbon fiber to its maximum, it is preferable to use roving yarns.

As compared with the cases where one of the prepreg 111 (first layer) and prepreg 112 (second layer) is used alone, the transport member 1 configured as mentioned above yields a bending rigidity better than that expectable from the respective tensile elasticities of the first and second layers, due to a synergetic effect obtained when they are combined together. Specifically, as compared with those in the conventional transport member having the same fore, the bending rigidity can remarkably be improved such that the bending elasticities in the longitudinal and transverse directions improve by about 2 to 10 times and about 3 to 10 times, respectively.

It is desirable for the prepregs of CFRP to exhibit a sufficient vibration damping characteristic when formed into a molded article. Specifically, it is desirable that the logarithmic vibration damping factor be usually 0.01 to 0.05, preferably 0.02 to 0.05 when a bending distortion of 1000 $\mu$ $\epsilon$ is exerted on a sample of CFRP (having a thickness of 1.5 mm) using only a carbon fiber as a reinforced fiber with its fiber volume content being 60 vol % in the state of a cantilever made of a unidirectional material as explained in the above-mentioned measuring method of "Logarithmic Vibration Damping Factor against Bending Vibration."

The prepregs 111 used in the skin layers 11a, 11b and the prepregs 123 used in the core layer 12 can exhibit such a logarithmic vibration damping factor, whereby the transport member 1 can fully enhance its vibration damping characteristic.

Since the bending rigidity is remarkably improved as mentioned above, the vibration damping characteristic of the transport member 1 against bending vibration can be improved in particular. Also, since the bending rigidity is improved remarkably, the occurrence of warpage and deflection can be suppressed to the minimum even when thermal load is exerted on the transport member 1 due to a thermal shock occurring at the time of letting the transport member 1 in or out of the electric furnace 4. Further, since the bending rigidity and the vibration damping characteristic against the bending vibration improve remarkably, the amount of use of CFRP can be reduced, whereby the transport member 1 can be made lighter in weight and easier to handle. As mentioned above, the logarithmic vibration damping factor of the transport member 1 against bending vibration is preferably 0.01 to 0.05, more preferably 0.02 to 0.05.

Since the pitch type carbon fiber of the prepregs 123 constituting the core layer 12 is oriented so as to obliquely intersect the respective orientating directions of the pitch type carbon fiber of the prepregs 111 and the PAN type carbon fiber of the prepregs 112, the torsional rigidity of the transport member 1 can be enhanced. As a result, the torsional vibration is lowered, and the vibration damping characteristic of the transport member 1 against the torsional vibration can be improved.

Since the tensile elasticity of the pitch type carbon fiber in the prepregs 123 is on a par with the tensile elasticity of the pitch type carbon fiber in the prepregs 111, the bending rigidity of the transport member 1 in the above-mentioned obliquely intersecting direction can be improved to a level on a par with the bending rigidity with respect to the longitudinal direction.

Since the pitch type carbon fiber is used as the reinforced fiber in the prepregs 111 and prepregs 123 whereas the PAN type carbon fiber is used as the reinforced fiber in the prepregs 112, the tensile elasticity required for the reinforced fiber in each prepreg can be attained quite easily, whereby each prepreg can be obtained reliably As a consequence, the bending rigidity, vibration damping characteristic, and the like of the transport member 1 can fully be improved.

The volume of the prepregs 111 constituting the skin layers 11a, 11b is 50 to 80 vol % of the total volume of the skin layers 11a, 11b, whereas the volume of the second layer constituting the skin layers 11a, 11b is 20 to 50 vol % of the total volume of the skin layers 11a, 11b, whereby the bending rigidities of the transport member 1 in the longitudinal and transverse directions can favorably be kept in balance.

When the volume of the prepreg 123 constituting the core layer 12 is 5 to 20 vol % of the total volume of the core layer 12 in particular, the torsional rigidity corresponding to the amount of use of the prepreg 123 can reliably be imparted to the transport member 1.

Since the total thickness $T_s$ of the skin layers 11a, 11b satisfy the condition represented by the above-mentioned expression (4), sufficient bending and vibration damping characteristics can be achieved by a minimally required amount of use of CFRP, and the transport member 1 excellent in lightness in weight and economy can be obtained The mode of prepregs 111, 112 is not limited to the unidirectional prepreg. Two-dimensional woven prepregs may be used as a part or all of them In the latter case, since the two-dimensional woven prepregs can improve the adhesiveness between individual prepregs, the bondability between the individual layers of the transport member 1, which is a laminate, can be enhanced.

When each prepreg 112 in the skin layers 11a, 11b is not a unidirectional prepreg but a woven prepreg, both sides thereof have irregularities, whereby its adhesion to the prepregs 111, each of which is a unidirectional prepreg, is improved.

When the prepregs positioned on the outermost sides of the skin layers 11a, 11b are constituted by a two-dimensional woven prepreg having a smooth surface side having a higher fiber density and a backside having a lower fiber density with irregularities, the smoothness of the skin layers 11a, 11b can be enhanced. Also, since a bismaleimide resin is used as the matrix for each prepreg, the heat resistance of the transport member 1 can further be improved.

Here, in order to further enhance the bending rigidity and torsional rigidity of the skin layers 11a, 11b so as to further improve the bending rigidity and torsional rigidity of the transport member 1, a prepreg of CFRP in which a carbon fiber is oriented by an angle range $\theta_3$ (see FIG. 1) of ±30° to ±60°, preferably ±35° to ±55°, more preferably ±40° to ±50° with respect to the longitudinal direction of the transport member 1 may be added to the skin layers 11a, 11b.

As such a carbon fiber, a pitch type carbon fiber is desirable. An example of mode of the prepreg is a unidirectional prepreg. A two-dimensional woven prepreg may be combined therewith. Also, they may be used as a laminate of a plurality of layers.

The volume ratio of this prepreg with respect to the skin layers 11a, 11b is preferably 0 to 30 vol % (there may be a case not using this prepreg), particularly preferably 5 to 10 vol %. At this time, the respective volume ratios of the prepregs 111, 112 constituting the skin layers 11a, 11b can be charged within the above-mentioned ranges suitable for them.

Though the prepregs 111, 123 are unidirectional prepregs while the prepreg 112 is a two-dimensional woven prepreg or unidirectional prepreg, the prepregs 111, 112, 123 maybe either unidirectional prepregs or two-dimensional woven prepregs.

The lengthwise and widthwise fiber densities of the two-dimensional woven prepreg may be either on a par with each other or different from each other. The ratio between the widthwise and lengthwise fiber densities is preferably 60:40 to 98:2, more preferably 65:35 to 90:10.

The texture of such a two-dimensional woven prepreg is not limited in particular. For example, plain weave, twill weave, satin weave, mock leno weave, weft twill weave, and the like may be used. The prepregs 111, 112, 123 may be other unidirectionally reinforced or two-dimensionally reinforced prepregs as well. As the two-dimensionally reinforced prepreg, nonwoven fabrics known as combined fabrics and other nonwoven fabrics can be used.

For keeping various physical properties inbalance when the skin layers 11a, 11b constituting the transport member 1 are laminates of a unidirectional prepreg (prepreg 111) and a two-dimensional prepreg (prepreg 112), it is preferred that the direction of unidirectional prepreg and the higher fiber density direction in the two-dimensional woven prepreg be orthogonal to each other.

Further, it will be preferable if the prepreg 113 as a cross layer including a fiber is disposed on the outer side (outermost surface) of the prepreg 111 acting as the outermost layers of the skin layers 11a, 11b. As the material for the prepreg 113, a woven fabric of a carbon fiber, e.g., PAN type carbon fiber, having a tensile elasticity of 200 to 400 GPa is used, whereas its texture is not restricted in particular. As its matrix, a bismaleimide resin, an epoxy resin, a cyanate resin, or a mixture of at least two kinds thereof is preferably used.

The thickness of each cross layer made of the prepreg 113 is preferably 0.1 to 0.7 mm. When the prepreg 113 is a two-dimensional woven prepreg, one made of satin weave having a higher fiber density in one direction and a lower fiber density in the other direction can be used, for example. Such a configuration is preferable from the viewpoints of smoothness in the surfaces of skin layers 11a, 11b and the adhesion to the unidirectional prepreg. When such a cross layer is provided as the outermost layer of the transport member 1, the surface of the transport member 1 can be prevented from yielding burrs and fluffs.

Though a bismaleimide resin is used as the matrix for the prepregs 111, 112, 113, 123, other resins may be used. A wide range of thermosetting resins and thermoplastic resins can appropriately be selected according to the aimed purpose.

Examples of thermosetting resins include not only bismaleimide resins, but also epoxy resins, cyanate resins, unsaturated polyester resins, epoxy acrylate resins, diallyl phthalate resins, phenol resins, vinyl ester resins, thermosetting polyimide resins, and melamine resins. When one of these resins or a mixture of two or more is impregnated with a reinforced resin, each prepreg can be manufactured. For improving physical properties or molding processability, plasticizers, stabilizers, and various other additives may be added to these resins.

The prepregs 111, 112, 113, 123 may further contain glass fibers, metal fibers, ceramic fibers, and the like, for example, as reinforced fibers other than the carbon fiber. As the glass fibers, various kinds of glass fibers such as E glass, S glass, and T glass can be used. These glass fibers do not greatly differ from each other in terms of elasticity. From the viewpoint of economy, E glass is desirable.

Examples of the metal fibers include stainless fibers, copper fibers, nickel fibers, titanium fibers, and tungsten fibers. Usable as the ceramic fibers are silicon carbide fibers, alumina fibers, titanium carbide fibers, and boron nitride fibers.

When such a reinforced fiber is used together with the carbon fiber in the prepregs 111, 112, 113, 123, it is desirable that the ratio of use of carbon fiber be at least 45% of the whole volume of the reinforced fiber. If the volume ratio of the carbon fiber is less than 45 vol %, there will be a fear of the skin layers 11a, 11b failing to attain their a required physical strength.

The volume ratio of the reinforced fiber and matrix resin in the skin layers 11a, 11b is such that the fiber volume content $V_f$ of the reinforced fiber is usually 30 to 80 vol %, preferably 40 to 70 vol %, whereas the resin volume content $V_m$ of the resin is usually 20 to 70 vol %, preferably 25 to 60 vol %. The bulk specific gravity of the skins 11a, 11b is preferably 1.4 to 2.

Voids (cavities) may inevitably be generated in the skin layers 11a, 11b upon manufacture. At this time, the void content $V_v$ is preferably 5 vol % or less, particularly preferably 3 vol % or less. At such a volume ratio, CFRP exhibiting the intensity required for the skin layers 11a, 11b can be obtained reliably.

The core member 121 having a honeycomb form is not limited in particular in terms of its form and material. Examples of the material include metals such as aluminum, glass, polycarbonate, aromatic polyamide (e.g., "Nomex" honeycomb manufactured by DuPont, USA), and paper.

The core member 121 made of such a material is obtained, for example, by filling a mold with a compound containing a thermosetting resin, placing a honeycomb product thereon, further supplying the compound thereon, and heating and molding thus obtained assembly under pressure. Here, a very small amount of compound infiltrates into the core member mainly in the surface layer part thereof and is solidified therein. When thus obtained core member 121 is used, the bulk specific gravity approximates preferably 0.03 to 0.5, more preferably 0.3 to 0.5, whereby the transport member 1 can be made with a further lighter weight.

As a core member made of other materials, one having a honeycomb form made of a three-dimensional fabric or fiber assembly using metal fibers, ceramic fibers, glass fibers, carbon fibers, or other organic fibers is also preferable. It will be more preferable if such a fibrous member is used with its strength being improved by fixation with the above-mentioned resin used in the matrix of the prepregs 111, 112, 113, 123.

It is also preferable for the core member 121 to use one having a void other than the honeycomb, such as a structure having a porous or corrugated form with a void, for example.

Usable as the porous body are inorganic hollow fillers such as glass balloon, volcanic ash balloon, and pearlite bound with thermosetting resins such as unsaturated polyester resin, vinyl ester resin, epoxy resin, thermosetting polyimide resin, and bismaleimide resin; foams made of metals, plastics, glass, or the like having continuous or discrete bubbles; porous plastics obtained by controlling their coagulation or by solvent extraction; three-dimensional woven fabrics or fiber assembly using metal fibers, ceramic fibers, glass fibers, carbon fibers, other organic fibers, or the like fixed with a resin; and the like.

As the glass fibers, various kinds of glass fibers such as E glass, S glass, and T glass can be used. These glass fibers do not greatly differ from each other in terms of elasticity. From the viewpoint of economy, E glass is desirable.

The core layer 12 may use FRP in addition to or in place of the core member 121. As the resin matrix for FRP, bismaleimide resins, epoxy resins, cyanate resins, unsaturated polyester resins, epoxy acrylate resins, diallyl phthalate resins, phenol resins, vinyl ester resins, thermosetting polyimide resins, melamine resins, and the like can be utilized. These resins can be used separately or in a mixture of at least two kinds. For improving physical properties or molding processability, plasticizers, stabilizers, and various other additives may be added to these resins.

As its reinforcement fiber, carbon fibers, glass fibers, ceramic fibers, metal fibers, and the like can be used. Among them, while glass fibers are preferable from the viewpoints of economy, carbon fibers are preferable when lightness in weight and high rigidity are required. Here, the bulk specific gravity can be made smaller when a PAN type carbon fiber is used. In this case, the bulk specific gravity can become 1.4 to 1.7.

As the glass fibers, various kinds of glass fibers such as E glass, S glass, and T glass can be used. These glass fibers do not greatly differ from each other in terms of elasticity. From the viewpoint of economy, E glass is desirable. These fibers maybe either short or long fibers, and may be continuous fibers.

As the mode of reinforcement of reinforced fiber in the FRP, unidirectional reinforcement, two-dimensional reinforcement, mat, felt, and the like can be used. Unidirectional prepregs are preferably used for unidirectional reinforcement, whereas two-dimensional woven prepregs are preferably used for two-dimensional reinforcement. Also, in the case of unidirectional reinforcement, unidirectional members whose reinforced fiber is made of a carbon fiber are used preferably. In this case, the carbon fiber can be oriented by ±75° to ±90° and/or ±30° to ±60° with respect to the longitudinal direction. Here, as the carbon fiber, one having a tensile elasticity of 200 to 400 GPa can be used preferably.

When a layer having an orientation of ±75° to ±90° is used for the core layer 12, the transport member 1 having a sufficient strength and rigidity can be obtained even without using a layer having an orientation of ±75° to ±90° for the skin layers 11a, 11b.

Also, a resin sheet can be used for the core layer 12. As the resin, bismaleimide resins, epoxy resins, cyanate resins, unsaturated polyester resins, epoxy acrylate resins, diallyl phthalate resins, phenol resins, vinyl ester resins, thermosetting polyimide resins, melamine resins, and the like can be utilized. These resins can be used separately or in a mixture of at least two kinds. For improving physical properties or molding processability, fillers, pigments, plasticizers, stabilizers, and various other additives may be added to these resins.

Usable as the fillers are mica, alumina, talc, finely powdered silica, wallastonite, zeolite, carbon black, alkali magnesium sulfate, calcium carbonate, polytetrafluoroethylene powder, zinc powder, aluminum powder, organic fine particles (acrylic fine particles, epoxy resin fine particles, polyamide fine particles, polyurethane fine particles, etc.), and the like. When such a resin sheet is used, the bulk specific gravity is set to 0.8 to 1.4.

Second and third embodiments of the transport member in accordance with the present invention will now be explained individually, As mentioned above, FIG. 4 is a perspective view showing the configuration of the second embodiment of the transport member in accordance with the present invention, illustrating an example of laminate structure of the transport member using a core member made of a porous body or the like.

Figure 4:
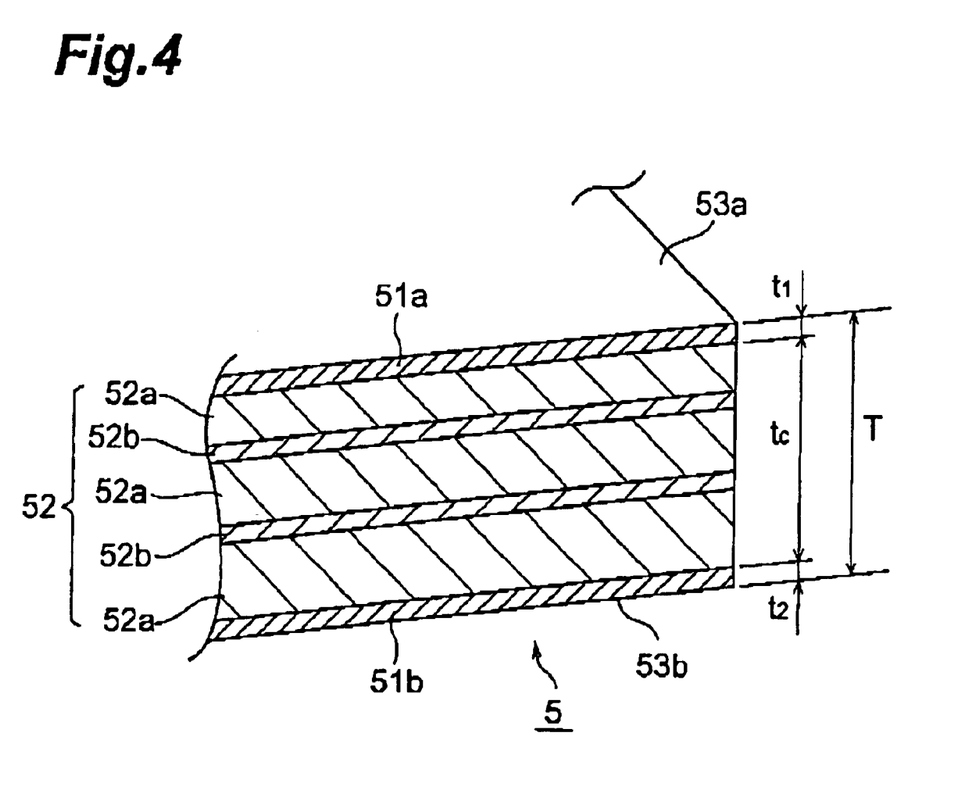
FIG. 4 is a perspective view showing the configuration of a second embodiment of the transport member in accordance with the present invention, illustrating an example of laminate structure in a case where a core member is used.

This transport member 5 is a laminate, composed of skin layers 51a, 51b and a core layer 52, having a form similar to that of the transport member 1 shown in FIG. 1. The skin layers 51a, 51b have the materials and configurations similar to those of the skin layers 11a, 11b constituting the transport member 1, whereas cross layers 53a, 53b are provided at their outermost surfaces, respectively. In this case, however, the cross layers 53a, 53b are not included in the skin layers 11a, 11b.

The core layer 52 is formed by porous layers 52a made of the above-mentioned porous body, and laminates 52b composed of prepregs of CFRP and glass-fiber reinforced plastic (hereinafter referred to as "GFRP").

Preferably, such a porous layer 52a is manufactured by preparing a compound in which an inorganic hollow filler having an average particle size of 100 μm or less and a bulk specific gravity of 0.5 or less, preferably 0.3 or less is uniformly mixed with an uncured thermosetting resin; and heating and molding this compound under pressure into a desirable form by use of a mold.

Though variable depending on the form, size, purpose, and the like of the porous layer 52a, the mixing ratio between the inorganic hollow filler and the resin is usually about 1:3 to 2:1 in terms of weight ratio. This can smooth the surface of the porous layer 52a, thereby making it possible to improve the bondability with respect to the laminate 52b, and further reduce the lightness in weight. Specifically, when the inorganic hollow filler having the above-mentioned bulk specific gravity is used, a very lightweight porous layer 52a having a bulk specific gravity of about 0.4 to 0.6 can be obtained.

The above-mentioned core member 121 having a honeycomb form may be used in combination with the porous layer 52a The total volume of prepreg in the CFRP constituting the laminate 52b is preferably 0 to 20 vol % (there may be a case not using this prepreg of CFRP), particularly preferably 5 to 20 vol % of the total volume of the core layer 52.

It is desirable that the thicknesses $t_1$ and $t_2$ of the skin layers 51a, 51b and the thickness $t_c$ of the core layer 52 satisfy the relationship represented by the above-mentioned expression (4). In this case, $t_c$ corresponds to $T_c$ in expression (4).

When the lightness it weight is required for the core layer 52, it may be made with a bulk specific gravity on a par with or lower than that of the skin layers 51a, 51b by use of a honeycomb, a porous body, or the like. In this case, the bulk specific gravity of the core layer 52 is preferably 0.3 to 1.7, more preferably 0.3 to 1.4.

As mentioned above, FIG. 5 is a perspective view showing the configuration of the third embodiment of the transport member in accordance with the present invention, illustrating an example of the configuration in the case where the transport member is formed into a tubular body.

Figure 5:
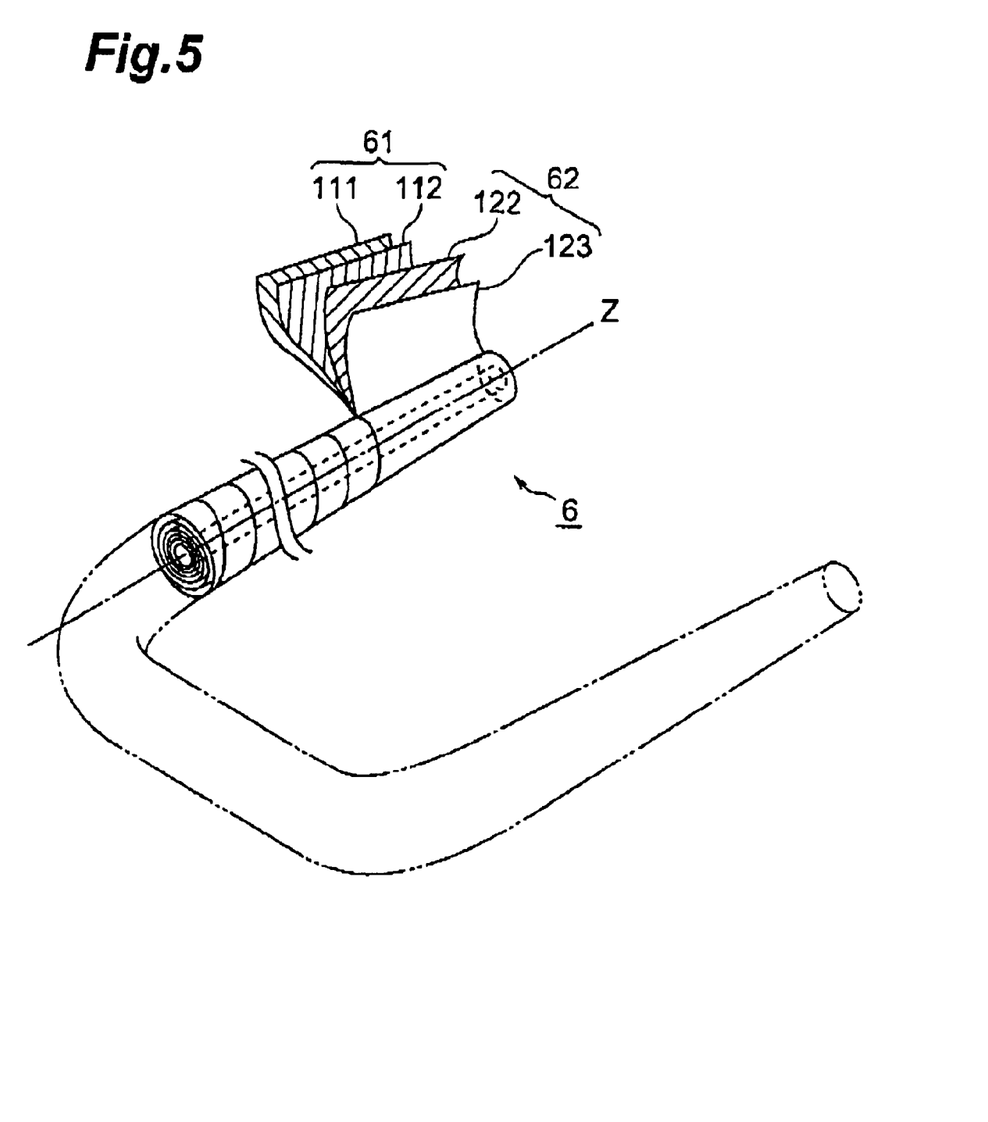
FIG. 5 is a perspective view showing the configuration of a third embodiment of the transport member in accordance with the present invention, illustrating an example of configuration in a case where the transport member is formed as a tubular body.

This transport member 6 is a tubular body in which a skin layer 61 formed by a laminate of the above-mentioned prepregs 111, 112 and a core layer 62 formed by a prepreg 122 of GFRP and a prepreg 123 of CFRP are wound. The transport member 6 is formed like letter U, in which the above-mentioned substrate 2 is adapted to be mounted on a part extending in the depicted Z-axis direction (axial direction of the tubular body) as the longitudinal direction, whereas the diameter of this part tapers down toward the front end.

The tubular body forming thus configured transport member 6 can be made when the above-mentioned prepregs are wound about a mandrel, for example, such that the carbon fibers contained therein have respective orientations falling within their corresponding angle ranges mentioned above with respect to the depicted Z-axis direction.

Preferably employed as the prepreg 111 in the transport member 6 for enhancing the vibration damping characteristic is a substituted prepreg sheet in which a prepreg using a pitch type carbon fiber with a tensile elasticity of 500 to 1000 GPa as a reinforced fiber is disposed in a portion extending from the end part having a smaller diameter to a part having a relatively large diameter, whereas a prepreg mainly using a PAN type carbon fiber with a tensile elasticity of 100 to 600 GPa is disposed in the remaining portion.

Within the same substituted prepreg sheet in the state wound as shown in FIG. 5, it will be favorable if the above-mentioned pitch type carbon fiber is oriented by an angle range of −20° to +20°, preferably −10° to +10° with respect to the depicted Z-axis direction, whereas the PAN type carbon fiber is oriented within a relative angle range of −5° to +5°, preferably −2° to +2° with respect to the orientating direction of pitch type carbon fiber, more preferably in substantially the same direction therewith.

Though the skin layers 11a, 11b are formed from CFRP whereas the core layer is formed from CFRP and the core member in each of the above-mentioned embodiments, the skin layers 11a, 11b may be formed from CFRP, GFRP, and the core member a whereas the core layer 12 may be formed from CFRP.

Also, the core layer 12 may be formed from one of CFRP, GFRP, and the core member alone, whereas FRP may contain other fibers. Further, while each of the transport members 1, 5, 6 has a bifurcated front end part or two so-called arm parts, the number of branched end parts or arm parts may be three or greater whereas the planar transport member 1 is not required to be branched.

The transport members 1, 5, 6 may have any suitable form other than the simple planar and tubular forms as long as the substrate and the like can be mounted thereon. The number and order of laminates in each of prepregs constituting the skin layers 11a, 11b, 51a, 51b, 61 and the core layers 12, 52, 62 are not limited to those depicted.

EXAMPLES

Specific examples in accordance with the present invention, which do not restrict the present invention, will now be explained.

Example 1

(1) Preparation of Skin Layer

A plurality of unidirectional prepreg sheets obtained by unidirectionally drawing pitch type carbon fibers having a tensile elasticity of 800 GPa and impregnating them with a bismaleimide resin were laminated such that their reinforcement directions became 0° (i.e., the same direction) with respect to the direction to become the longitudinal direction of the transport member, whereas a plurality of unidirectional prepreg sheets obtained by unidirectionally drawing PAN type carbon fibers having a tensile elasticity of 230 GPa and impregnating them with a bismaleimide resin were laminated with the former prepreg sheets such that their reinforcement directions became 90° (i.e., the orthogonal direction) with respect to the above-mentioned longitudinal direction.

Thus obtained laminate was autoclaved, whereby a skin layer having a thickness of about 1.2 mm was prepared. Here, the volume ratio of the former prepreg using pitch type carbon fibers was 75% in the skin layer, whereas the remaining 25% was the latter prepreg using PAN type carbon fibers.

(2) Preparation of Core Layer

A plurality of unidirectional prepreg sheets obtained by unidirectionally drawing pitch type carbon fibers having a tensile elasticity of 600 GPa and impregnating them with a bismaleimide resin were laminated such that their reinforcement directions became ±45° with respect to the direction to become the longitudinal direction of the transport member and such that the volume ratio of these prepreg sheets in the core layer became 5%, whereas a plurality of layers of prepreg made of glass fibers impregnated with a bismaleimide resin were laminated in the remaining part, whereby a Core layer having a thickness of about 5.6 mm was prepared.

(3) Preparation of Transport Member

The above-mentioned core layer was disposed and bonded between two skin layers each of which is mentioned above. Further, a woven fabric of carbon fibers having a tensile elasticity of 230 GPa (satin weave with a thickness of 0.1 mm) was attached to the surface of each of the skin layers, so as to form cross layers, whereby a laminate was obtained. This laminate was processed into the form of the transport member 1 shown in FIG. 1, whereby the transport member 1 having a length of 1000 mm, a width of 600 mm (with a bifurcated part having a width of about 20 mm), and a thickness of about 8.2 mm was prepared.

Comparative Example 1

A plurality of unidirectional prepreg sheets obtained by unidirectionally drawing pitch type carbon fibers having a tensile elasticity of 230 GPa and impregnating them with a bismaleimide resin were laminated such that their reinforcement directions became 0° (i.e., the same direction) with respect to the above-mentioned longitudinal direction, and then both surfaces thereof were formed with cross layers identical to those in the above-mentioned Example 1, so as to yield a laminate having a thickness of about 8.2 mm, which was processed into the same form as that in the above-mentioned Example 1, whereby the transport member was prepared.

Example 2

A laminate (transport member) was prepared in the same manner as the above-mentioned Example 1 except that its total thickness was 1.5 mm (whereas the volume ratio of each prepreg sheet and the thickness ratio between the skin and core layers were the same as that in Example 1) and that no cross layers were provided.

Comparative Example 2

A laminate (transport member) was prepared in the same manner as the above-mentioned Comparative Example 1 except that its total thickness was 1.5 mm and that no cross layers were provided.

Example 3

(1) Preparation of Molded Sheet

A plurality of unidirectional prepreg sheets obtained by unidirectionally drawing pitch type carbon fibers having a tensile elasticity of 800 GPa and impregnating them with a bismaleimide resin were laminated such that their reinforcement directions became 0° (i.e., the same direction) with respect to the direction to become the longitudinal direction of the transport member, whereas a plurality of unidirectional prepreg sheets obtained by unidirectionally drawing PAN type carbon fibers having a tensile elasticity of 230 GPa and impregnating them with a bismaleimide resin were laminated with the former prepreg sheets such that their reinforcement directions became 90° (i.e., the orthogonal direction) with respect to the above-mentioned longitudinal direction. Thus obtained laminate was autoclaved, whereby a molded sheet was prepared. Here, the 0° and 90° layers mentioned above had a volume ratio of 0° layer:90° layer= 30%:70%.

(2) Preparation of Transport Member

A woven fabric of carbon fibers having a tensile elasticity of 230 GPa (satin weave with a thickness of 0.1 mm) was attached to the surface of each of two skin layers of the molded sheet prepared by the above-mentioned (1), so as to form cross layers, whereby a laminate was obtained. This laminate was processed into the form of the transport member 1 shown in FIG. 1, whereby the transport member 1 having a length of 1000 mm, a width of 600 mm (with a bifurcated part having a width of about 20 ma), and a thickness of about 8.2 mm was prepared.

Thermal Shock Test

The transport member 1 obtained in each of Examples 1 and 3 was put into the electric furnace shown in FIG. 2 at 200° C. in the atmosphere for 10 minutes in the state where a graphite sheet (with a weight of about 1 kg) having substantially the same form as the substrate 2 was mounted thereon (at the position of the substrate 2 shown in FIG. 1). Thereafter, the transport member was subjected to 50 cycles of a thermal shock test in which the transport member was taken out of the furnace and then left for 10 minutes at room temperature so as to be cooled with air. As a result, disorders such as warpage and peeling did not occur at all. Also, weight did not change at all between before and after the test.

Before and after the thermal shock test, the tare deflection of the transport member 1 was measured at both front end parts thereof in the state of a cantilever shown in FIG. 2. As a result, there was no change in the amount of deflection between before and after the thermal shock at both end parts of each of the transport members obtained by Examples 1 and 3, whereby it was verified that no increase in deflection occurred due to the thermal load before and after the thermal shock test. From the foregoing results of thermal shock test, it can be understood that the transport member of the present invention has a sufficient heat resistance.

Bending Test

The following Table 1 shows results of bending elasticity measurement using each of the transport members prepared in Examples 1 and 3 and comparative Example 1 as a sample. From these test results, it has been verified that the bending rigidity of the transport member in accordance with the present invention is remarkably improved as compared with that obtained conventionally.

TABLE 1

| Item | Ex. 1 | Ex. 3 | Comp. Ex. 1 |
|---|---|---|---|
| Bending elasticity (longitudinal direction) | 230 GPa | 300 GPa | 110 GPa |
| Bending elasticity (transverse direction) | 50 GPa | 50 GPa | 10 GPa |

Vibration Test

Using each of the transport members prepared in Example 2 and Comparative Example 2 as a sample, a bending distortion of 1000 $\mu \epsilon$ was applied to each sample, and its logarithmic vibration damping factor against bending vibration was determined by the measuring and calculating methods mentioned above.

As a result, the logarithmic vibration damping factor in Example 2 was about 0.03, whereas the logarithmic vibration damping factor in Comparative Example 2 was about 0.009. Thus, Example 2 exhibited a logarithmic vibration damping factor more than three times as high as that of Comparative Example 2. From these results, it has been verified that the vibration damping characteristic of the transport member in accordance with the present invention is greatly improved as compared with that conventionally obtained.

As explained in the foregoing, the present invention can yield a transport member which is light in weight, easy to handle, and excellent in its bending rigidity, vibration damping characteristic, and heat resistance, thus being sufficiently suitable for transporting large-size substrates and the like in high-temperature environments.

What is claimed is:

1. A transport member consisting essentially of fiber-reinforced plastic, wherein said transport member is used for transporting an article to be transported, said transport member is supported in a cantilever state while transporting the article, and said transport member has a logarithmic vibration damping factor of 0.01 to 0.05 against bending vibration;

wherein said fiber-reinforced plastic comprises:

at least one first layer containing a unidirectional reinforced fiber, oriented by −20° to +20° with respect to a longitudinal direction of said transport member, having a tensile elasticity of 500 to 1000 GPa; and at least one second layer containing a unidirectional reinforced fiber, oriented by +75° to +90° or −75° to −90° with respect to said longitudinal direction of said transport member, having a tensile elasticity of 200 to 400 GPa.

2. A transport member according to claim 1, wherein said fiber-reinforced plastic further comprises at least one third layer, said at least one third layer containing a unidirectional reinforced fiber, oriented by +30° to +60° or −30° to −60° with respect to said longitudinal direction of said transport member, having a tensile elasticity of 500 to 1000 GPa.

3. A transport member comprising skin and core layers consisting essentially of a fiber-reinforced plastic;

wherein said transport member is used for transporting an article to be transported, said transport member is supported in a cantilever state while transporting the article, said transport member has a logarithmic vibration damping factor of 0.01 to 0.05 against bending vibration; and said skin layer comprises at least two first layers containing a unidirectional reinforced fiber, oriented by −20° to +20° with respect to a longitudinal direction of said transport member, having a tensile elasticity of 500 to 1000 GPa.

4. A transport member according to claim 3, wherein said core layer comprises at least two second layers containing a unidirectional reinforced fiber, oriented by +75° to +90° or −75° to −90° with respect to said longitudinal direction of said transport member, having a tensile elasticity of 200 to 400 GPa; or at least one third layer containing a unidirectional reinforced fiber, oriented by +30° to +60° or −30° to −60° with respect to said longitudinal direction of said transport member, having a tensile elasticity of 500 to 1000 GPa.

5. A transport member comprising laminated skin and core layers made of carbon-fiber reinforced plastic, wherein said transport member is used for transporting an article to be transported;

wherein said transport member is supported in a cantilever state while transporting the article;

said transport member has a logarithmic vibration damping factor of 0.01 to 0.05 against bending vibration; and said skin layer comprises:

a first layer containing a first carbon fiber, oriented by an angle range of −20° to +20° with respect to a longitudinal direction of said transport member, having a tensile elasticity of 500 to 1000 GPa; and a second layer containing a second carbon fiber, oriented by an angle range of +75° to +90° or −75° to −90° with respect to said longitudinal direction, having a tensile elasticity of 200 to 400 GPa.

6. A transport member according to claim 1, 3, or 5, wherein said transport member has a bending elasticity of 200 to 800 GPa in said longitudinal direction, and a bending elasticity of 30 to 100 GPa in a transverse direction thereof.

7. A transport member according to claim 3 or 5, wherein said transport member satisfies the relationship represented by the following expression (1):

$$(T_s+T_c) \times 0.2 \leq T_s \leq (T_s+T_c) \times 0.4 \tag{1}$$

where $T_s$ is the thickness of said skin layer; and $T_c$ is the thickness of said core layer.

8. A transport member according to claim 3 or 5, wherein said first layer in said skin layer has a volume of 20 to 10 vol % in said skin layer.

9. A transport member according to claim 4 or 5, wherein said second layer has a volume of 0 to 80 vol % in said skin layer.

10. A transport member according to claim 4, wherein said third layer in said core layer has a volume of 0 to 20 vol % in said core layer.

11. A transport member according to claim 1, 3, or 5, wherein said transport member has a logarithmic vibration damping factor of 0.01 to 0.05 against bending vibration.

12. A transport member according to claim 3 or 5, wherein said core layer has a bulk specific gravity falling within the range of 0.03 to 1.7 and smaller than that of said skin layer.

13. A transport member according to claim 5, wherein said core layer comprises a honeycomb, a porous body, a corrugated sheet, a fiber-reinforced plastic, or a resin sheet.

14. A transport member according to claim 1, 3, or 5, wherein said transport member has a general fork shape, and comprises a proximal portion secured to a fixing element to define said cantilever state, and a bifurcated portion supporting the article to be transported.

* * * * *